(12) United States Patent
Gautam et al.

(10) Patent No.: US 10,601,407 B2
(45) Date of Patent: Mar. 24, 2020

(54) RC OSCILLATOR WITH COMPARATOR OFFSET COMPENSATION

(71) Applicant: NXP USA, INC., Austin, TX (US)

(72) Inventors: Bodh Raj Gautam, Solan (IN); Kaushlendra Trivedi, New Delhi (IN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/049,821

(22) Filed: Jul. 31, 2018

(65) Prior Publication Data

US 2020/0044634 A1 Feb. 6, 2020

(51) Int. Cl.
| H03K 3/26 | (2006.01) |
| H03K 4/08 | (2006.01) |
| H03K 5/24 | (2006.01) |

(52) U.S. Cl.
CPC .............. *H03K 4/08* (2013.01); *H03K 5/24* (2013.01)

(58) Field of Classification Search
CPC .................................. H03K 4/08; H03K 5/24
USPC ................................................. 331/111, 143
See application file for complete search history.

(56) References Cited

U.S. PATENT DOCUMENTS

| 5,870,000 | A | * | 2/1999 | Matsuda | .............. | H03K 3/0231 |
| | | | | | | 331/111 |
| 7,034,627 | B1 | | 4/2006 | Kudari | | |
| 8,054,141 | B2 | | 11/2011 | Saw | | |
| 9,385,649 | B2 | | 7/2016 | Wang et al. | | |
| 9,823,687 | B2 | | 11/2017 | Mukherji et al. | | |
| 2012/0086515 | A1 | | 4/2012 | Yang et al. | | |

FOREIGN PATENT DOCUMENTS

| CN | 107332541 A | 11/2017 |
| WO | WO-2010/129927 A1 | 11/2010 |

OTHER PUBLICATIONS

Arun Paidimarri et al., A 120nW 18.5kHz RC Oscillator with Comparator Offset Cancellation for ±0.25% Temperature Stability, ISSCC 2013, pp. 184-186, 2013.

* cited by examiner

*Primary Examiner* — Richard Tan
(74) *Attorney, Agent, or Firm* — Charlene R. Jacobsen

(57) ABSTRACT

A comparator-based oscillator generates an output frequency that is relatively independent of comparator offset voltages. Charging/discharging circuitry controls the comparator input voltage, and logic circuitry generates the oscillator output (e.g., clock) signal and controls the charging/discharging circuitry. During an oscillator charging cycle, the charging/discharging circuitry drives the voltage at the comparator input node from a relatively low initial charging voltage level up to the comparator reference voltage. During an oscillator discharging cycle, the charging/discharging circuitry drives the voltage at the comparator input node from a relatively high initial discharging voltage level down to the comparator reference voltage. The initial charging and discharging voltage levels depend on the comparator reference voltage, such that a comparator offset voltage directly affects the initial charging and discharging voltage levels, thereby keeping the output frequency relatively unchanged.

5 Claims, 6 Drawing Sheets

| Voff/Vref | CONVENTIONAL ERROR | INVENTION ERROR | CONVENTIONAL ERROR % | INVENTION ERROR % | ERROR RATIO (CONVENTIONAL/INVENTION) |
|---|---|---|---|---|---|
| 0.01 | 0.019900662 | 0.000300075 | 1.436 | 0.022 | 66.3 |
| 0.02 | 0.039605255 | 0.001201201 | 2.857 | 0.087 | 33.0 |
| 0.03 | 0.059117604 | 0.00270609 | 4.264 | 0.195 | 21.8 |
| 0.04 | 0.078441426 | 0.004819286 | 5.658 | 0.348 | 16.3 |
| 0.05 | 0.097580328 | 0.007547206 | 7.039 | 0.544 | 12.9 |
| 0.06 | 0.116537816 | 0.010898191 | 8.406 | 0.786 | 10.7 |
| 0.07 | 0.135317297 | 0.014882583 | 9.761 | 1.074 | 9.1 |
| 0.08 | 0.153922082 | 0.019512814 | 11.103 | 1.408 | 7.9 |
| 0.09 | 0.172355392 | 0.024803517 | 12.433 | 1.789 | 6.9 |
| 0.1 | 0.19062036 | 0.030771659 | 13.750 | 2.220 | 6.2 |
| 0.11 | 0.208720031 | 0.0374367 | 15.056 | 2.700 | 5.6 |
| 0.12 | 0.226657371 | 0.04482078 | 16.350 | 3.233 | 5.1 |
| 0.13 | 0.244435265 | 0.052948937 | 17.632 | 3.819 | 4.6 |
| 0.14 | 0.262056525 | 0.061849362 | 18.903 | 4.461 | 4.2 |
| 0.15 | 0.279523885 | 0.071553692 | 20.163 | 5.162 | 3.9 |
| 0.16 | 0.29684001 | 0.29684001 | 21.412 | 5.922 | 3.6 |
| 0.17 | 0.314007498 | 0.093520001 | 22.651 | 6.746 | 3.4 |
| 0.18 | 0.331028877 | 0.105865903 | 23.879 | 7.637 | 3.1 |
| 0.19 | 0.347906614 | 0.119184578 | 25.096 | 8.597 | 2.9 |
| 0.2 | 0.364643114 | 0.133531393 | 26.303 | 9.632 | 2.7 |

RC OSCILLATOR WITH COMPARATOR OFFSET COMPENSATION

BACKGROUND

The present invention relates to electronics and more particularly to oscillators for generating clock signals.

RC (resistance-capacitance) oscillators are widely used in semiconductor products. This is because an RC oscillator is an inexpensive clock source and allows for the generation of various frequencies by changing resistance, capacitance, and/or reference voltage levels. For some conventional RC oscillator designs, an undesired offset voltage in the oscillator's voltage comparator will produce a clock signal having an unintended frequency.

FIG. 1A shows a conventional RC oscillator 100, which includes switches SW1 and SW2, a resistor R, a capacitor C, a comparator 102, three inverters 104, 106, and 110, and a D-type flip-flop (DFF) 108. FIG. 1B shows timing diagrams of a voltage Vcap across the capacitor C, an inverter output signal 107 (φ), and a clock signal clk_out of FIG. 1A, where the solid curves correspond to a no-offset situation in which a comparator reference voltage Vcmp is Vref/2 and there is no comparator offset voltage Voff, and the broken curves correspond to a positive comparator-offset situation in which effective Vcmp is (Vref/2+Voff).

As shown in FIG. 1B, at the beginning of operations, the voltage Vcap at the positive input to the comparator 102 is 0V. At that time, with the (positive) comparator reference voltage Vcmp applied to the negative-input port of the comparator 102, the comparator output 103 will be low, the output 105 ($\bar{\phi}$) of the inverter 104 will be high, the output 107 (φ) of the inverter 106 will be low, the Q output signal 109 of the DFF 108 (i.e., the clock signal clk_out) will be low, and the D input signal 111 of the DFF 108 (i.e., the output of the inverter 110) will be high.

With the inverter output 105 high and the inverter output 107 low, the switch SW1 will be closed and the switch SW2 will be open, such that the capacitor C will be charged by the high supply voltage Vref through the resistor R. As a result, the voltage Vcap rises from 0V towards Vref.

When the voltage Vcap surpasses the voltage Vcmp, the comparator output 103 will go high, the inverter output 105 will go low, and the inverter output 107 will go high. When the inverter output 107 (i.e., the clock input to the DFF 108) goes high, the DFF 108 will be clocked, thereby passing the high D input signal 111 to the Q output signal 109 and driving the clock signal clk_out high and the inverter output 111 low.

When the inverter output 105 goes low, the switch SW1 is opened, and, when the inverter output 107 goes high, the switch SW2 is closed. As a result, the capacitor C is rapidly discharged to ground through the switch SW2, and the voltage Vcap drops quickly to 0V. As a result, the comparator output 103 again goes low, the inverter output 105 again goes high, and the inverter output 107 again goes low. As a result, the switch SW1 is again closed and the switch SW2 is again opened, thereby again charging the capacitor C and driving the voltage Vcap towards Vref.

Here, too, when the voltage Vcap surpasses the voltage Vcmp, the comparator output 103 will go high, the inverter output 105 will go low, and the inverter output 107 will go high. When the inverter output 107 goes high, the DFF 108 will be clocked, thereby passing the low D input signal 111 to the Q output signal 109 and driving the clock signal clk_out low and the inverter output 111 high.

This alternating cycling continues with each successive charging cycle of the capacitor C generating the next half cycle of the clock signal clk_out. The duty cycle of the inverter output 107 (φ) is much less than 50%. The divide-by-two functionality of the DFF 108 is required to produce a clock signal clk_out with the desired 50% duty cycle.

When there is no comparator offset voltage Voff, the RC oscillator 100 will produce the clock signal clk_out at the desired frequency. If, however, there is a (positive or negative) comparator offset voltage Voff, then the frequency of the clock signal clk_out will differ from the desired frequency. In particular, if the comparator offset voltage Voff is positive, then the frequency of clk_out will be lower than the desired frequency, and, if the comparator offset voltage Voff is negative, then the frequency of clk_out will be higher than the desired frequency.

The time period T of the RC oscillator 100 of FIG. 1A is given by:

$$T = rc * \left\{ 2*\ln(2) + 2*\ln\left[1 + \frac{Voff}{Vref}\right] \right\},$$

where r is the resistance of the resistor R, and c is the capacitance of the capacitor C. When the comparator offset voltage Voff is 0V, then the time period T is 2rc*ln(2) or 1.386rc. When a positive comparator offset voltage Voff is 10% of the reference voltage Vref, then the time period T is 2rc*[ln(2)+ln(1.1)] or 1.577rc. Thus, a 10% positive comparator offset voltage results in a 14% increase in the time period T. When a negative comparator offset voltage Voff is 10% of the reference voltage Vref, then the time period T is 2rc*[ln(2)+ln(0.9)] or 1.176rc. Thus, a 10% negative comparator offset voltage results in a 15% decrease in the time period T.

The impact of a positive comparator offset voltage Voff is illustrated by the broken curves in FIG. 1B, which shows that it takes more time to drive the voltage Vcap to surpass the now-higher effective comparator reference voltage (Vcmp=Vref/2+Voff) during each charging cycle of the capacitor C, thereby lowering the frequency of clk_out below the desired frequency. Analogously, for a negative offset voltage Voff, it would take less time to drive the voltage Vcap to surpass the now-lower effective comparator reference voltage Vcmp during each charging cycle of the capacitor C, thereby raising the frequency of clk_out above the desired frequency.

It would be advantageous to have an RC oscillator that is less susceptible to comparator offset.

BRIEF DESCRIPTION OF THE DRAWINGS

The invention, together with objects and advantages thereof, may best be understood by reference to the following description of the presently preferred embodiments together with the accompanying drawings in which:

FIG. 3 is a table comparing the results for the RC oscillator 100 of FIG. 1A and the RC oscillator 200 of FIG. 2A for different positive offset voltage levels ranging from 1% to 20% of the high supply voltage Vref.

DETAILED DESCRIPTION OF THE PREFERRED EMBODIMENTS

One aspect of the present invention is an oscillator, including charging/discharging circuitry that controls voltage at a comparator input node, a comparator that generates a comparator output signal indicative of whether the voltage at the comparator input node is greater than or less than a comparator reference voltage, and logic circuitry that generates an oscillator output signal and controls the charging/discharging circuitry based on the comparator output signal.

During a charging cycle of the oscillator, the charging/discharging circuitry drives the voltage at the comparator input node from a relatively low initial charging voltage level up to the comparator reference voltage. During a discharging cycle of the oscillator, the charging/discharging circuitry drives the voltage at the comparator input node from a relatively high initial discharging voltage level down to the comparator reference voltage. The initial charging and discharging voltage levels are dependent upon the comparator reference voltage such that a comparator offset voltage directly affects the initial charging and discharging voltage levels.

Other aspects and advantages of the present invention will become apparent from the following description, taken in conjunction with the accompanying drawings, illustrating by way of example the principles of the invention.

Figure 2A:
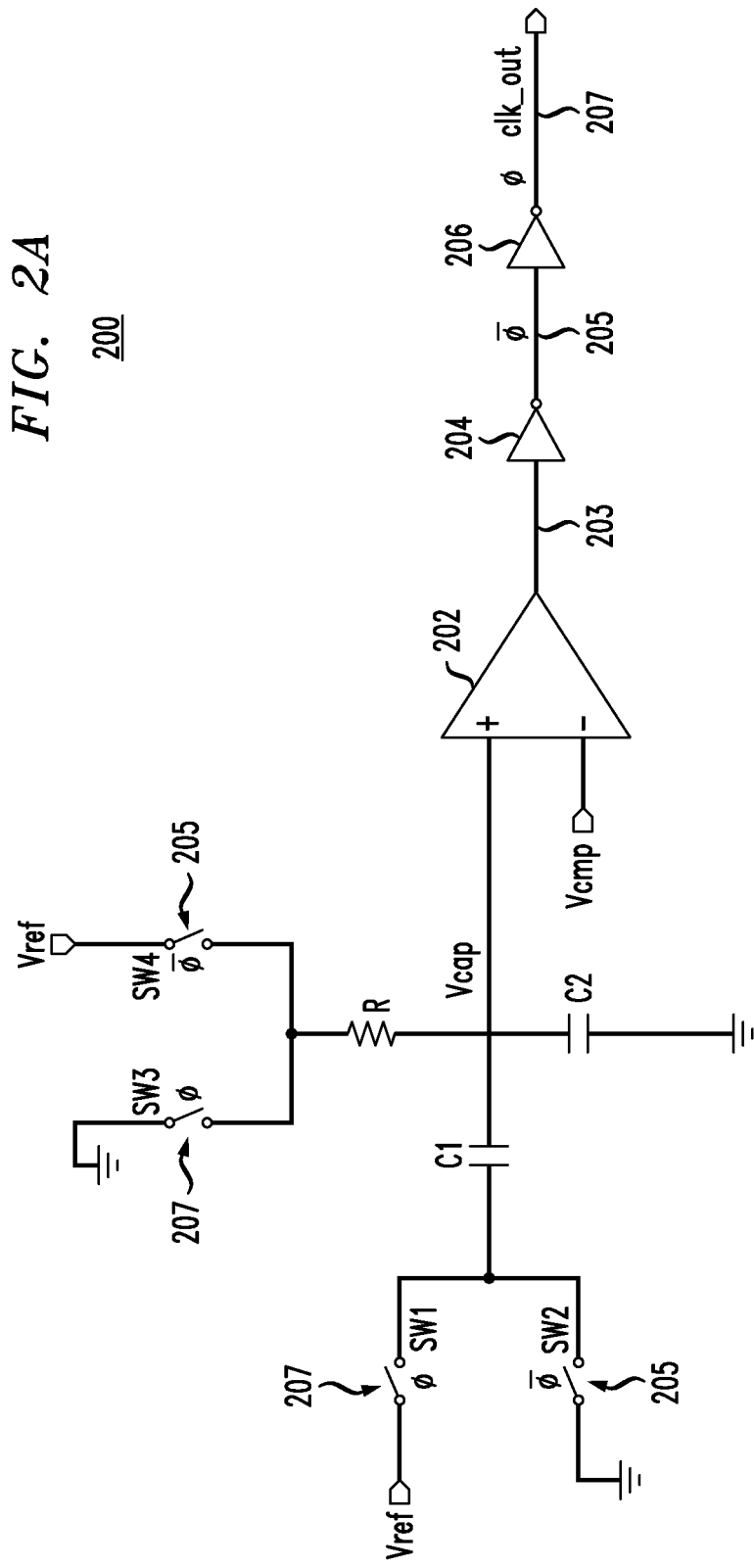
FIG. 2A is a schematic circuit diagram of an RC oscillator circuit in accordance with an embodiment of the present invention.

Referring now to FIG. 2A, an RC oscillator 200 according to an embodiment of the present invention includes first through fourth switches SW1-SW4, a resistor R, first and second capacitors C1 and C2, a comparator 202, and first and second inverters 204 and 206. The first switch SW1 is connected between a high supply reference voltage Vref and the first capacitor C1, and the second switch SW2 is connected between a low supply reference voltage, in this case ground, and the first capacitor C1. The third switch SW3 is connected between the low supply reference voltage, ground, and the resistor R, and the fourth switch SW4 is connected between the high supply reference voltage Vref and the resistor R1.

The comparator 202 has a positive input terminal connected to a node labeled Vcap, and a negative input terminal that receives a comparator reference voltage Vcmp. The first capacitor C1 is connected between the first and second switches SW1 and SW2 on one side and the node Vcap on the other side. The second capacitor C2 has one side connected to ground and the other side connected to the node Vcap. The resistor R is connected between the third and fourth switches SW3 and SW4 on one side and the node Vcap on the other side.

The first and second inverters 204 and 206 are connected in series, with the input of the first inverter 204 being connected to the output of the comparator 202 for receiving the comparator output 203, and the output of the second inverter 204 providing a clock output signal clk_out 207. The first and third switches SW1 and SW3 are controlled by the output 207 (φ) of the second inverter 206, and the second and fourth switches SW2 and SW4 are controlled by the output 205 ($\bar{\phi}$) of the first inverter 204.

Figure 2B:
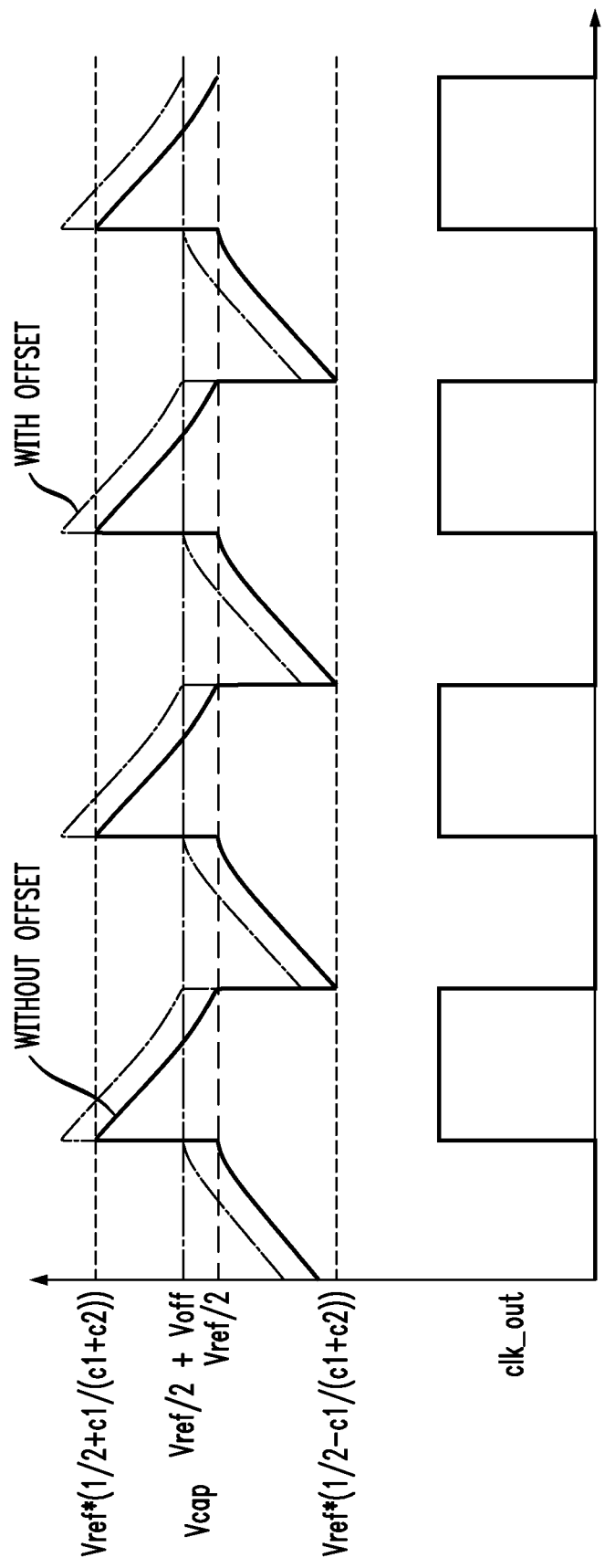
FIG. 2B shows timing diagrams for certain signals in the RC oscillator of FIG. 2A.

FIG. 2B presents timing diagrams of the voltage Vcap (where the solid curve corresponds to Vcap with no comparator offset voltage and the broken curve corresponds to Vcap with a positive comparator offset voltage) and the clock signal clk_out (for both no comparator offset voltage and the positive comparator offset voltage).

Although not illustrated in FIG. 2B, at the beginning of operations, the voltage Vcap is 0V. At that time, with the comparator reference voltage Vcmp applied to the negative-input port of the comparator 202, the comparator output 203 will be low, the first inverter 204 output 205 ($\bar{\phi}$) will be high, and clk_out 207 (φ) will be low.

With the first inverter 204 output 205 high and the second inverter 296 output clk_out 207 low, the second and fourth switches SW2 and SW4 will be closed and the first and third switches SW1 and SW3 will be open, such that the first and second capacitors C1 and C2 will be charged by the high supply voltage Vref through the resistor R. As a result, the voltage Vcap rises towards Vref.

When the voltage Vcap surpasses the comparator reference voltage Vcmp, the comparator output 203 will go high, the first inverter output 205 will go low, and the second inverter output clk_out 207 will go high. When the inverter output 205 goes low, the second and fourth switches SW2 and SW4 are opened, and, when clk_out goes high, the first and third switches SW1 and SW3 are closed. As a result, the voltage Vcap will jump up from Vcmp to a relatively high initial discharging voltage level:

$$Vcmp + \left(Vref * \frac{c1}{c1+c2}\right),$$

where c1 is the capacitance of the first capacitor C1, and c2 is the capacitance of the second capacitor C2.

With the first and third switches SW1 and SW3 closed and the second and fourth switches SW2 and SW4 open, the capacitors C1 and C2 will drain through the resistor R towards the low supply voltage (i.e., ground). When the voltage Vcap falls below the comparator reference voltage Vcmp, the comparator output 203 again goes low, the first inverter output 205 again goes high, and clk_out again goes low. As a result, the switches SW2 and SW4 are closed and the switches SW1 and SW3 are opened.

As a result, the left side of the capacitor C1 is rapidly switched from Vref to 0V, causing the voltage Vcap to drop down from Vcmp to a relatively low initial charging voltage level:

$$Vcmp - \left(Vref * \frac{c1}{c1+c2}\right).$$

With the switches SW1 and SW3 open and the switches SW2 and SW4 closed, the capacitors C1 and C2 will again be charged through the resistor R towards Vref. When the voltage Vcap again surpasses the comparator reference voltage Vcmp, the comparator output 203 again goes high, the inverter output 205 again goes low, and clk_out goes high.

This alternating charging and discharging cycling continues with each charging cycle of the capacitors C1 and C2 generating one half of a cycle of the clock signal clk_out and each discharging cycle of the capacitors C1 and C2 generating the other half of each cycle of the clock signal clk_out. As shown in FIG. 2B, the duty cycle of the inverter output 207 is 50%. As such, the inverter output 207 can be used as the clock signal clk_out, and no divide-by-two function is required to convert a low duty-cycle signal (such as the inverter output 107 of FIG. 1A) into a 50% duty-cycle signal. As a result, the RC oscillator 200 of FIG. 2A does not require a D-type flip-flop like the DFF 108 of FIG. 1A, which can result in power savings of up to 50% for the RC oscillator 200 compared to the RC oscillator 100. Note that, in RC oscillator 200 of FIG. 2A, the inverter output 205 could be used as the clock signal clk_out instead of the inverter output 207.

Assuming that the capacitances c1 and c2 are equal, when the comparator reference voltage Vcmp is equal to one half of the high supply voltage Vref, at the beginning of each discharging cycle of the capacitors C1 and C2, the voltage Vcap is driven to an initial discharging voltage level of Vref, i.e., $$Vcmp + \left(Vref * \frac{c1}{c1+c2}\right) = \frac{Vref}{2} + \left(Vref * \frac{1}{2}\right) = Vref,$$

and, at the beginning of each charging cycle of the capacitors C1 and C2, the voltage Vcap is driven to an initial charging voltage level of 0V, i.e., $$Vcmp - \left(Vref * \frac{c1}{c1+c2}\right) = \frac{Vref}{2} - \left(Vref * \frac{1}{2}\right) = 0.$$

Furthermore, when the comparator reference voltage Vcmp is equal to one half the reference voltage Vref, the RC oscillator 100 will produce the clock signal clk_out at the desired frequency.

FIG. 2B shows what happens when there is a positive comparator offset Voff resulting in an effective comparator reference voltage Vcmp=Vref/2+Voff. Although not shown in FIG. 2B, it will take more time for the voltage Vcap to surpass the now-higher effective comparator reference voltage Vcmp during the very first charging cycle of the capacitors C1 and C2. At that time, when the switches SW1 and SW3 are closed and the switches SW2 and SW4 are opened, the voltage Vcap will jump up to a now-higher initial discharging voltage level:

$$Vref/2 + Voff + \left(Vref * \frac{c1}{c1+c2}\right)$$

due to the effective Vcmp being higher than Vref/2 by Voff. If the capacitances c1 and c2 are equal, then Vcap will be driven to an initial discharging voltage level of Vref+Voff. The voltage Vcap will then begin to discharge towards ground. But now the comparator output 203 will be driven low when Vcap falls below the now-higher effective Vcmp (i.e., Vref/2+Voff), so the time that it takes to discharge the capacitors C1 and C2 is not significantly affected by the presence of the comparator offset voltage Voff.

Similarly, at that time, when the switches SW1 and SW3 are opened and the switches SW2 and SW4 are closed, the voltage Vcap will jump down to a now-higher initial charging voltage level:

$$Vref/2 + Voff - \left(Vref * \frac{c1}{c1+c2}\right)$$

due to the effective Vcmp being higher than Vref/2 by Voff. If the capacitances c1 and c2 are equal, then Vcap will be driven to an initial charging voltage level of Voff. The voltage Vcap will again begin to charge towards Vref. But now the comparator output 203 will be driven high when Vcap surpasses the now-higher effective Vcmp, so the time that it takes to charge the capacitors C1 and C2 is also substantially unchanged by the presence of the comparator offset voltage Voff.

As a result, after the very first clock cycle, the frequency of the clock signal clk_out with a non-zero comparator voltage offset Voff will be substantially the same as the frequency of the clock signal clk_out with no comparator voltage offset Voff.

Analogously, when the comparator voltage offset Voff is negative, then the voltage Vcap will be driven (i) below Vref (i.e., Vref+Voff, where Voff has a negative value), when the capacitances c1 and c2 are equal) at the beginning of each discharging cycle of the capacitors C1 and C2 and (ii) below 0V (i.e., Voff, when the capacitances c1 and c2 are equal) at the beginning of each charging cycle of the capacitors C1 and C2. However, since the effective Vcmp will be below Vref/2 due to the negative Voff, the durations of the charging and discharging cycles will again be substantially unchanged, and the frequency of the clock signal clk_out will also be substantially unchanged.

When the capacitances c1 and c2 are equal, the time period T of the RC oscillator 200 of FIG. 2A is given by:

$$T = rc * \left\{ 2 * \ln(2) + \ln\left[\frac{1 + \frac{voff}{vref}}{1 + 2 * \frac{voff}{vref}}\right] + \ln\left[\frac{1 - \frac{voff}{vref}}{1 - 2 * \frac{voff}{vref}}\right] \right\},$$

where r is the resistance of the resistor R, and c is the sum of c1 and c2. When the comparator offset voltage Voff is 0V, then the time period T is 2rc*ln(2) or 1.386rc. When a positive comparator offset voltage Voff is 10% of the reference voltage Vref, then the time period T is rc+[2*ln(2)+ln (0.917)+ln(1.125] or 1.417rc. Thus, a 10% positive comparator offset voltage results in a 2% increase in the time period T. When a negative comparator offset voltage Voff is 10% of the reference voltage Vref, then the time period T is also 1.417rc. Thus, a 10% negative comparator offset voltage also results in a 2% increase in the time period T.

Figure 1A:
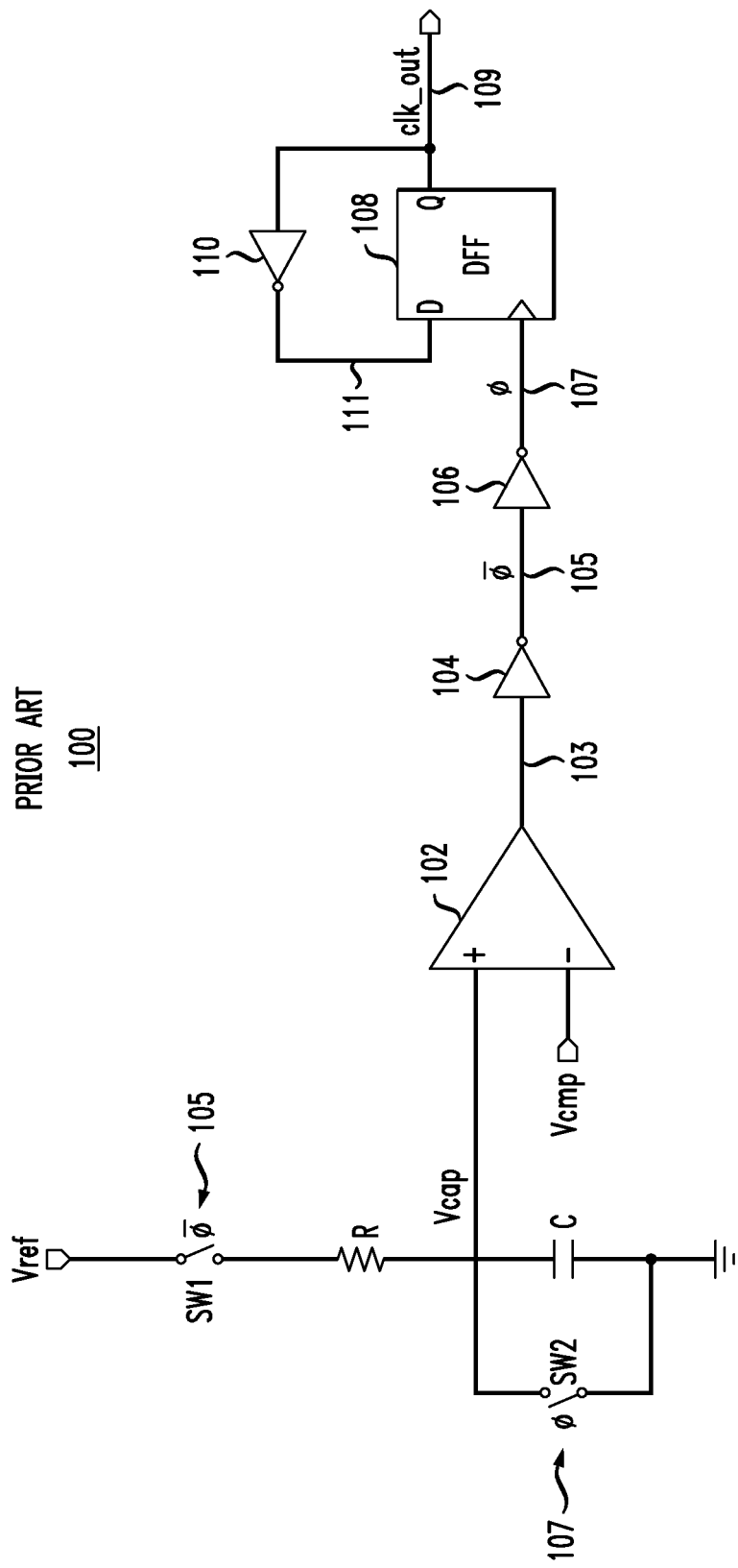
FIG. 1A is a schematic circuit diagram of a conventional RC oscillator.
Figure 1B:
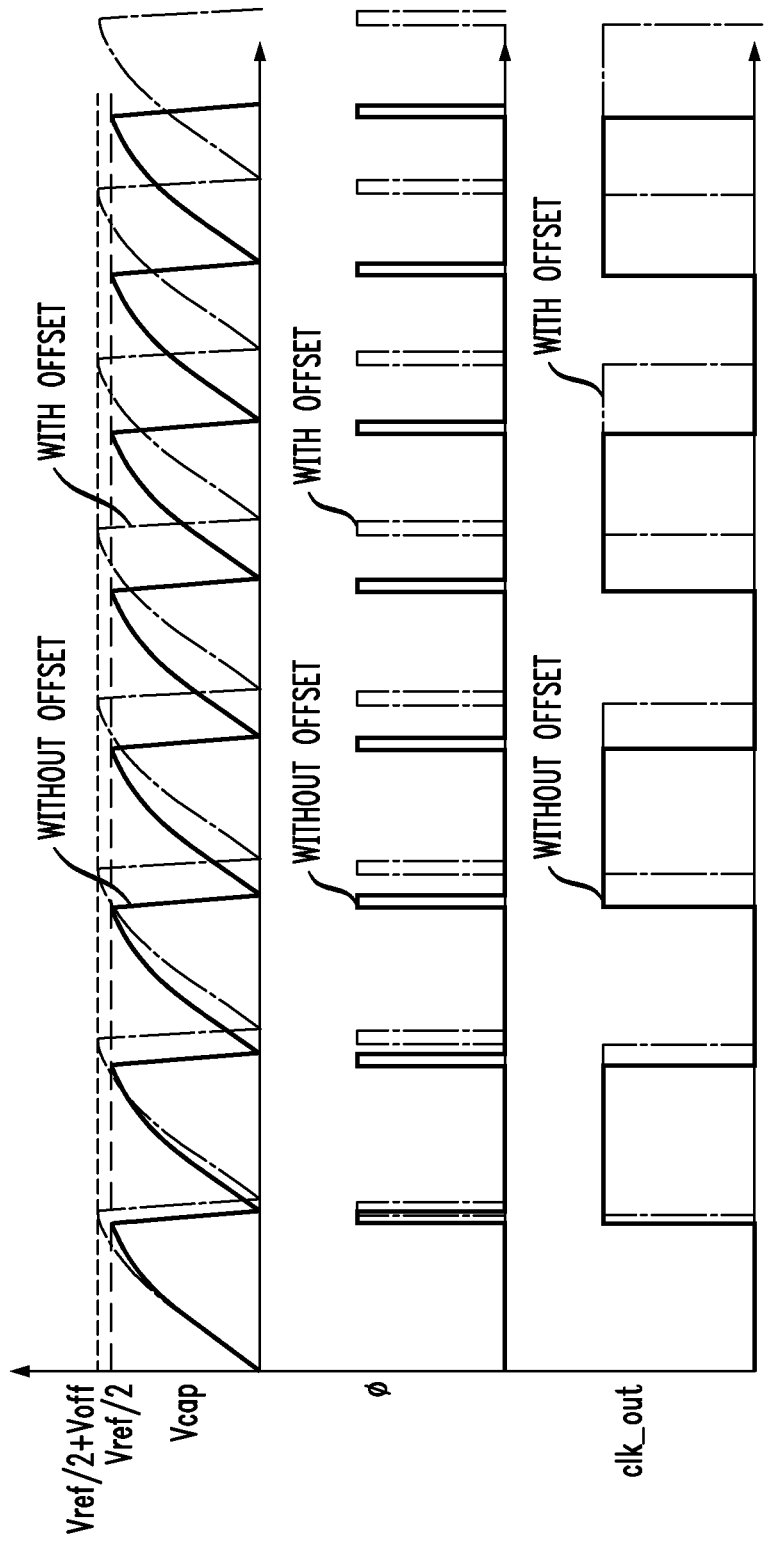
FIG. 1B shows timing diagrams for certain signals in the RC oscillator of FIG. 1A.

FIG. 3 is a table comparing the results for the conventional RC oscillator 100 of FIG. 1A and the RC oscillator 200 of FIG. 2A for different positive comparator offset voltage levels ranging from 1% to 20% of Vref. As shown in FIG. 3, the frequency of the RC oscillator 200 is less affected by the presence of any particular comparator offset voltage Voff in the effective comparator reference voltage Vcmp than is the frequency of the conventional RC oscillator 100 of FIG. 1A.

Figure 4:
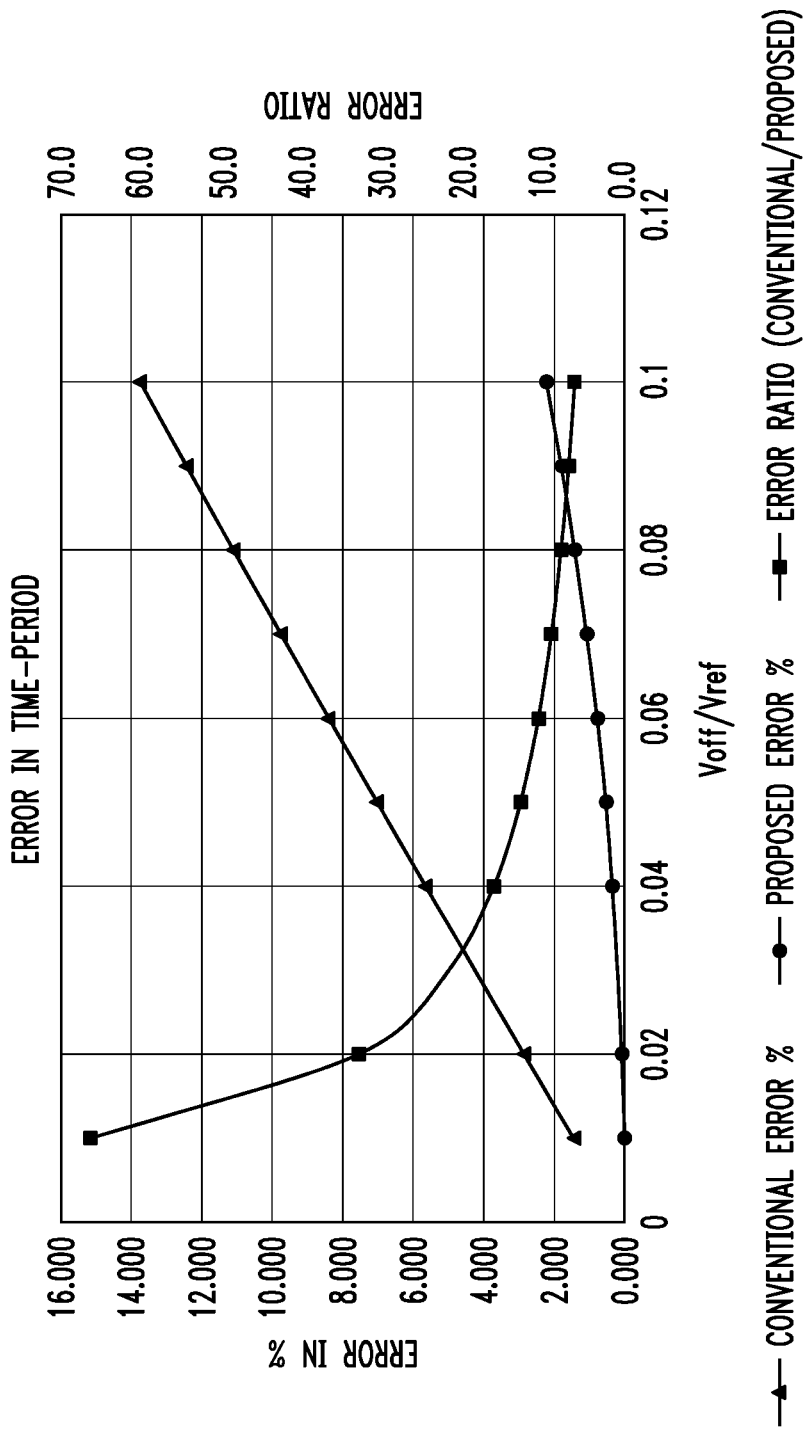
FIG. 4 is a graphical representation of the results tabulated in FIG. 3.

FIG. 4 is a graphical representation of the results tabulated in FIG. 3 illustrating advantages of the invention.

When the capacitances c1 and c2 are equal, the duty cycle of the clock signal clk_out of FIG. 2A is given by:

$$rc * \left\{ \ln(2) + \ln\left[\frac{1 + \frac{Voff}{Vref}}{1 + 2 * \frac{Voff}{Vref}}\right] \right\} / T.$$

Thus, when the comparator offset voltage Voff is 0V, the duty cycle is 50%. For a 10% positive comparator offset voltage Voff, the duty cycle is 41%. For a 10% negative comparator offset voltage Voff, the duty cycle is 62%.

By making the initial charging and discharging voltage levels dependent on the effective comparator reference voltage Vcmp, the output signal clk_out is generated to be symmetrical around Vcmp, which makes the frequency of clk_out relatively insensitive to comparator offset voltages in Vcmp.

The resistor R, the capacitors C1 and C2, and the switches SW1-SW4 of FIG. 2A form a particular implementation of charging/discharging circuitry that controls the comparator input voltage Vcap at the comparator positive-input node. Those skilled in the art will understand that other implementations of analogous charging/discharging circuitry are possible.

Similarly, the inverters 204 and 206 form a particular implementation of logic circuitry that generates the oscillator output signal clk_out and controls the charging/discharging circuitry. Here, too, those skilled in the art will understand that other implementations of analogous logic circuitry are possible as long as appropriate phases are maintained. In other implementations, other logic gates can be used while integrating the oscillator with a system-on-chip (SoC), depending upon the top-level requirements. For example, a power-on-reset signal can be used in a circuit with appropriate logic gates to drive necessary functionality out of the oscillator during powering ON of the SoC.

Although the comparator 202 has been described in the context of the comparator reference voltage Vcmp being Vref/2, those skilled in that art will understand that the comparator reference voltage Vcmp can be set at other voltage levels between Vref and ground, such as (without limitation) Vref/3 or Vref/4.

Although the comparator 202 has the comparator reference voltage Vcmp applied to the comparator negative-input port and the comparator input voltage Vcap applied to the comparator positive-input port, those skilled in the art will understand that, in alternative implementations, the voltages could be reversed with appropriate changes in the charging/discharging circuitry and/or the logic circuitry.

Although the invention has been described in the context of the RC oscillator 200, which has a high supply voltage of Vref and a low supply voltage of ground, those skilled in the art will understand that other suitable voltage levels above or below Vref and/or above or below ground may be used for the high and/or low supply voltages.

It should be apparent to those skilled in the art that the present invention may be embodied in many other specific forms without departing from the spirit or scope of the invention. Particularly, it should be understood that the present invention may be embodied in the following forms.

Signals and corresponding terminals, nodes, ports, or paths may be referred to by the same name and are interchangeable for purposes here.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The present examples and embodiments are to be considered as illustrative and not restrictive, and the invention is not to be limited to the details given herein, but may be modified within the scope and equivalence of the appended claims.

The invention claimed is:

1. An oscillator, comprising:
charging/discharging circuitry that controls voltage at a comparator input node, wherein the charging/discharging circuitry includes:
   first and second capacitors and a resistor connected to the comparator input node, wherein the second capacitor is connected between the comparator input node and a relatively low supply voltage; and
   switches configured to selectively connect the first capacitor and the resistor to either a relatively high supply voltage or the low supply voltage;
a comparator that generates a comparator output signal indicative of whether the voltage at the comparator input node is greater than or less than a comparator reference voltage; and
logic circuitry that generates an oscillator output signal and controls the charging/discharging circuitry based on the comparator output signal, wherein:
   during a charging cycle of the oscillator, the charging/discharging circuitry drives the voltage at the comparator input node from a relatively low initial charging voltage level up to the comparator reference voltage; and
   during a discharging cycle of the oscillator, the charging/discharging circuitry drives the voltage at the comparator input node from a relatively high initial discharging voltage level down to the comparator reference voltage, wherein the initial charging and discharging voltage levels are dependent upon the comparator reference voltage such that a comparator offset voltage directly affects the initial charging and discharging voltage levels;
   at the end of the charging cycle, the switches are reconfigured such that (i) the resistor is connected to the low supply voltage and (ii) the first capacitor is connected to the high supply voltage; and
   at the end of the discharging cycle, the switches are reconfigured such that (i) the resistor is connected to the high supply voltage and (ii) the first capacitor is connected to the low supply voltage.

2. The oscillator of claim 1, wherein:
a first switch is connected between the first capacitor and the high supply voltage;
a second switch is connected in parallel with the first switch between the first capacitor and the low supply voltage;
a third switch is connected between the resistor and the low supply voltage; and
a fourth switch is connected in parallel with the third switch between the resistor and the high supply voltage.

3. The oscillator of claim 2, wherein the logic circuitry comprises:
a first inverter that (i) is connected to the output of the comparator and (ii) generates a first control signal for the second and fourth switches; and
a second inverter that (i) is connected to the output of the first inverter and (ii) generates a second control signal for the first and third switches.

4. An RC oscillator with comparator offset compensation, the oscillator comprising:

a comparator having a negative input terminal that receives a comparator reference voltage (Vcmp), and a positive input terminal that receives a capacitor voltage (Vcap);

a first inverter having an input connected to an output of the comparator for receiving a comparator output signal, and an output that provides a first inverter output ($\bar{\phi}$);

a second inverter connected in series with the first inverter, wherein the second inverter receives the first inverter output and provides a clock output signal ($\phi$);

a first switch (SW1) having a first side that receives a high reference voltage (Vref);

a second switch (SW2) having a first side that receives a low reference voltage and a second side that is connected to a second side of the first switch;

a third switch (SW3) having a first side that receives the low reference voltage;

a fourth switch (SW4) having a first side that receives the high reference voltage (Vref) and a second side that is connected to a second side of the third switch;

a first capacitor (C1) having a first side connected to the second sides of the first and second switches;

a second capacitor (C2) having one side connected to the low reference voltage and a second side connected to a second side of the first capacitor; and a resistor (R) having a first side connected to the second sides of the third and fourth switches, and a second side connected to the second sides of the first and second capacitors, wherein the capacitor voltage (Vcap) is generated at the node formed by the connection of the second sides of the first and second capacitors and the resistor, and wherein the first and third switches are controlled by the output of the first inverter output ($\bar{\phi}$), and the second and fourth switches are controlled by the clock output signal ($\phi$), wherein during a charging cycle, the voltage at the capacitor voltage (Vcap) is driven from a relatively low initial charging voltage level up to the comparator reference voltage (Vcmp), and during a discharging cycle, the capacitor voltage (Vcap) is driven from a relatively high initial discharging voltage level down to the comparator reference voltage (Vcmp), and wherein the initial charging and discharging voltage levels are dependent upon the comparator reference voltage (Vcmp).

5. The RC oscillator of claim 4, wherein:

at the end of the charging cycle, the first through fourth switches are configured such that (i) the resistor is connected to the low reference voltage and (ii) the first capacitor is connected to the high reference voltage; and at the end of a discharging cycle, the switches are reconfigured such that (i) the resistor is connected to the high reference voltage and (ii) the first capacitor is connected to the low reference voltage.

* * * * *